(12) United States Patent
Lin et al.

(10) Patent No.: US 11,908,896 B2
(45) Date of Patent: *Feb. 20, 2024

(54) INTEGRATED CIRCUIT STRUCTURE WITH NON-GATED WELL TAP CELL

(71) Applicant: Taiwan Semiconductor Manufacturing Co., Ltd., Hsin-Chu (TW)

(72) Inventors: Jiefeng Lin, Hsinchu (TW); Jeng-Ya Yeh, New Taipei (TW); Chih-Yung Lin, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/859,731

(22) Filed: Jul. 7, 2022

(65) Prior Publication Data

US 2022/0352318 A1 Nov. 3, 2022

Related U.S. Application Data

(63) Continuation of application No. 16/881,467, filed on May 22, 2020, now Pat. No. 11,387,321, which is a
(Continued)

(51) Int. Cl.
| | |
|---|---|
| *H01L 29/06* | (2006.01) |
| *H01L 21/02* | (2006.01) |
| *H01L 29/08* | (2006.01) |
| *H01L 29/417* | (2006.01) |
| *H01L 21/324* | (2006.01) |

(Continued)

(52) U.S. Cl.
CPC .... *H01L 29/0847* (2013.01); *H01L 21/02381* (2013.01); *H01L 21/02579* (2013.01); *H01L 21/30625* (2013.01); *H01L 21/324* (2013.01); *H01L 21/76224* (2013.01); *H01L 29/41791* (2013.01)

(58) Field of Classification Search
None
See application file for complete search history.

(56) References Cited

U.S. PATENT DOCUMENTS

| | | |
|---|---|---|
| 6,368,933 B1 | 4/2002 | Clark et al. |
| 6,388,315 B1 | 5/2002 | Clark et al. |

(Continued)

*Primary Examiner* — Asok K Sarkar
(74) *Attorney, Agent, or Firm* — HAYNES AND BOONE, LLP

(57) ABSTRACT

The present disclosure provides a method that includes receiving a semiconductor substrate that includes an integrated circuit (IC) cell and a well tap cell surrounding the IC cell; forming first fin active regions in the well tap cell and second fin active regions in the IC cell; forming a hard mask within the well tap cell, wherein the hard mask includes openings that define first source/drain (S/D) regions on the first fin active region of the well tap cell; forming gate stacks on the second fin active regions within the IC cell and absent from the well tap cell, wherein the gate stacks define second S/D regions on the second fin active regions; epitaxially growing first S/D features in the first S/D regions using the hard mask to constrain the epitaxially growing; and forming contacts landing on the first S/D features within the well tap cell.

20 Claims, 15 Drawing Sheets

Related U.S. Application Data continuation of application No. 16/263,656, filed on Jan. 31, 2019, now Pat. No. 10,665,673.

(60) Provisional application No. 62/691,209, filed on Jun. 28, 2018.

(51) Int. Cl.
*H01L 21/762* (2006.01)
*H01L 21/306* (2006.01)

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,230,960 B1 | 1/2016 | Greiner |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 9,704,873 B2 | 7/2017 | Morimoto et al. |
| 10,157,910 B2 | 12/2018 | Xu et al. |
| 10,665,673 B2 | 5/2020 | Lin |
| 11,387,321 B2 * | 7/2022 | Lin .................. H01L 21/76202 |
| 2012/0068310 A1 | 3/2012 | Uemura |

* cited by examiner

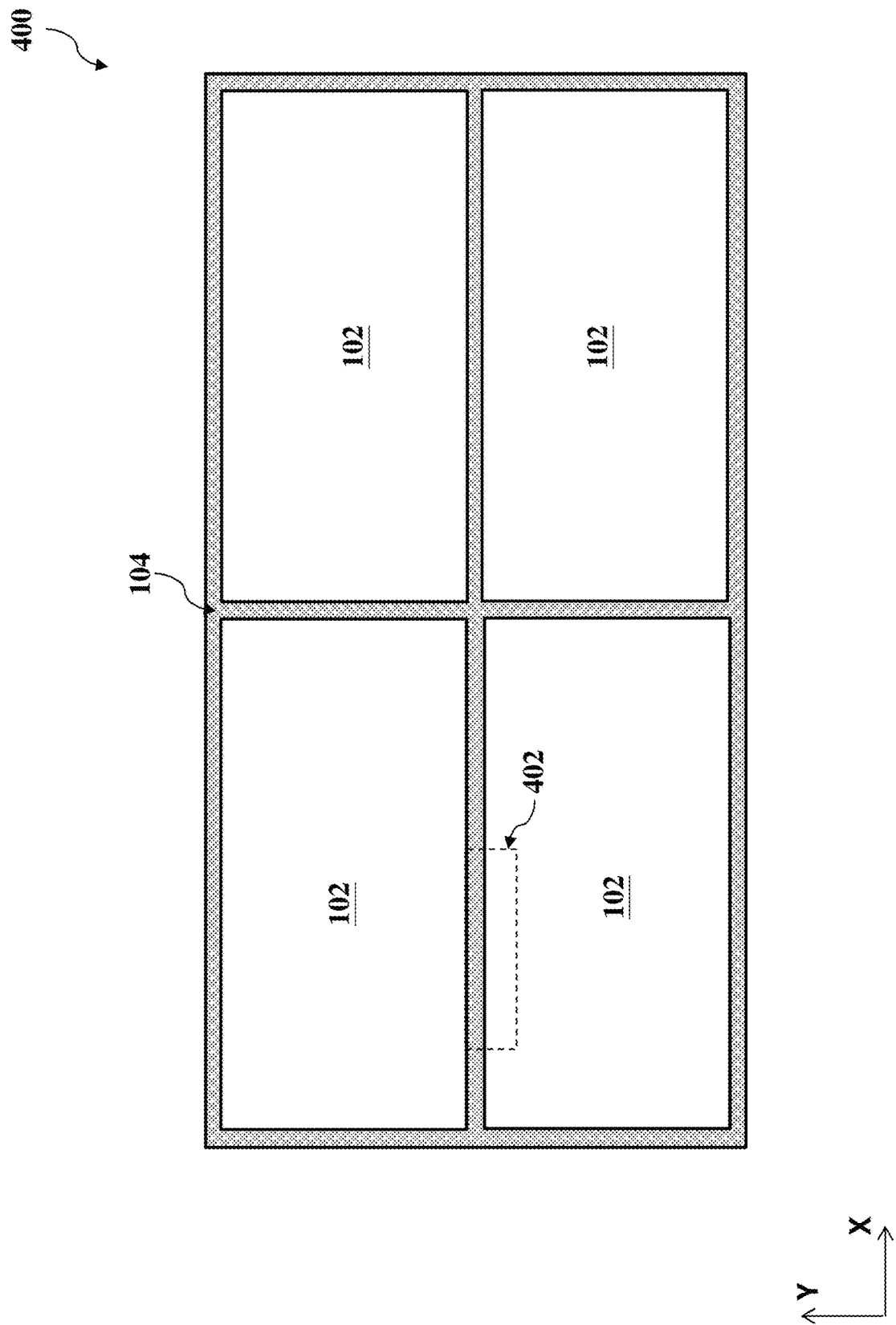

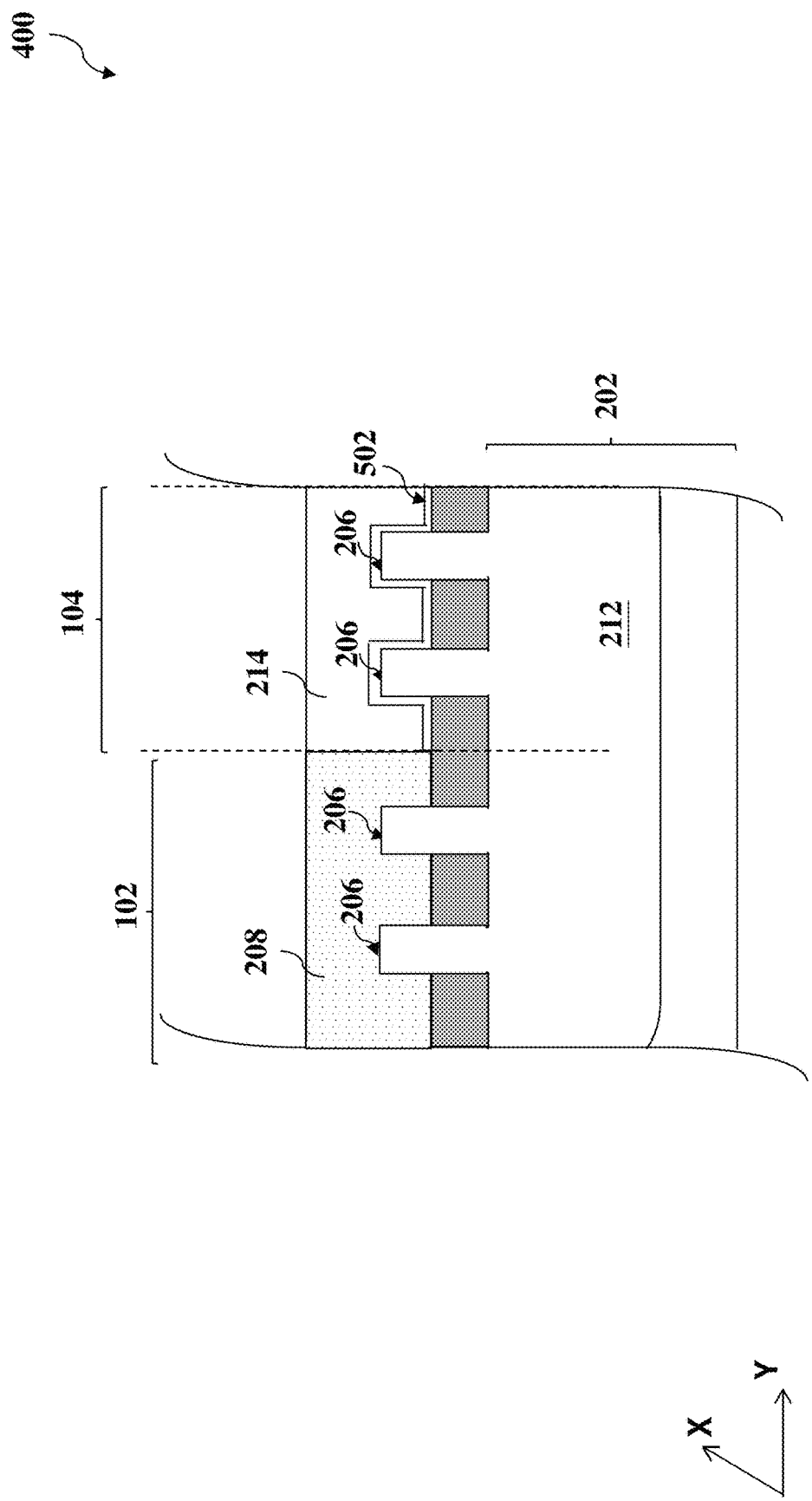

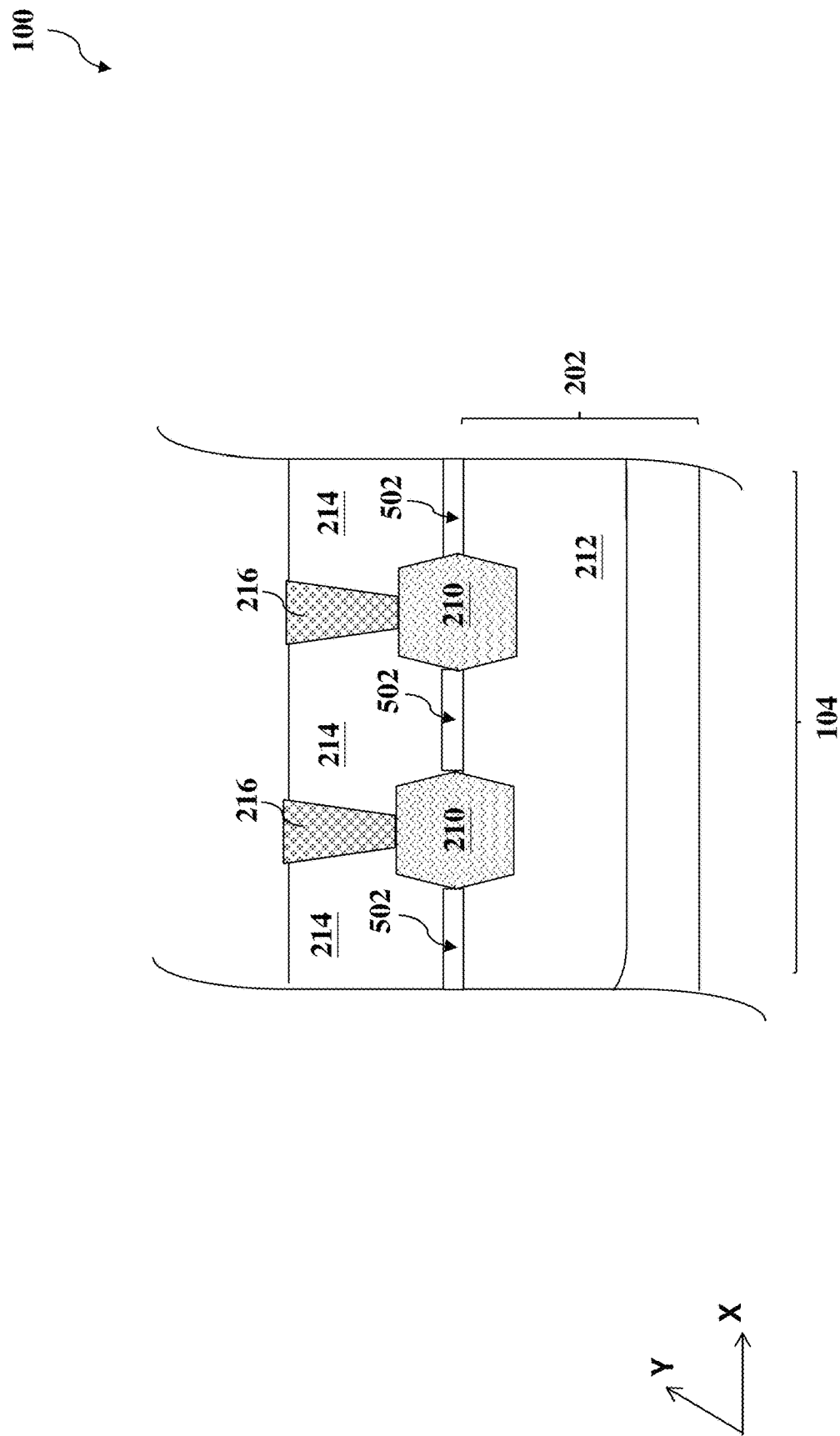

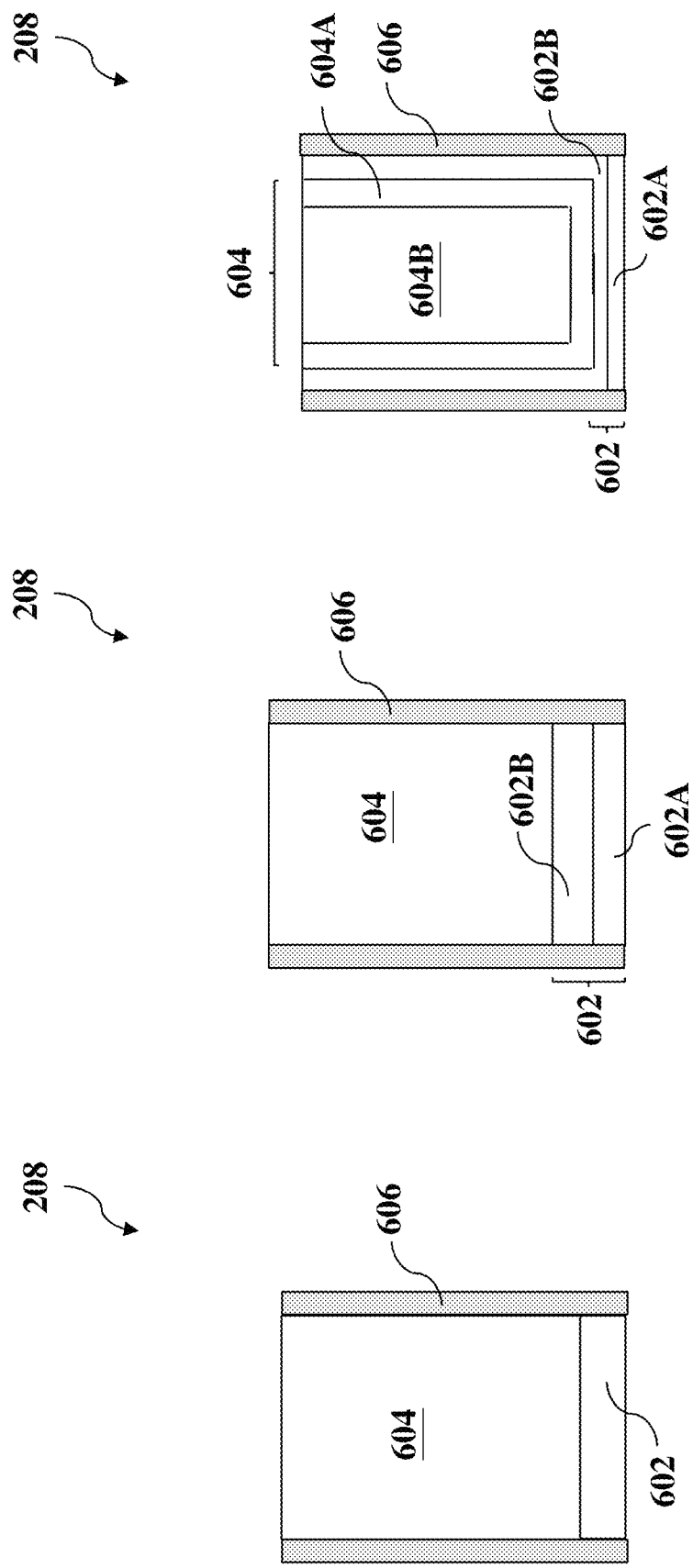

INTEGRATED CIRCUIT STRUCTURE WITH NON-GATED WELL TAP CELL

CROSS-REFERENCE TO RELATED APPLICATIONS

This application is a continuation of U.S. patent application Ser. No. 16/881,467 filed on May 22, 2020, which is a continuation of U.S. patent application Ser. No. 16/263,656 filed on Jan. 31, 2019, which further claims priority to U.S. Provisional Patent Application Ser. No. 62/691,209 filed on Jun. 28, 2018, the entire disclosures of which are incorporated herein by reference.

BACKGROUND

An integrated circuits (IC) includes various device cells each with certain function. Those cells may be surrounded by a guard ring to provide consistent working environment to the devices in the IC cells. The existing guard ring structures experience various issues or concerns. For example, the guard ring includes dummy gates and source/drain features formed with the dummy gates to constrain the source/drain formation. However, the dummy gates are constrained to follow the gate design rule, such as the spacing between the gate ends, therefore increasing the size of the guard ring and reducing the circuit area. Further, the dummy gates also increase the gate density, which further leads to high manufacturing risk, such as CMP dishing or erosion. It is therefore desired to have an integrated circuit structure, and the method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 4 is a top view of an integrated circuit (IC) structure constructed according to some embodiments.

FIG. 5B is a sectional view of the IC structure of FIG. 5A along the dashed line AA', constructed according to some embodiments.

FIG. 5D is a sectional view of the IC structure of FIG. 5A along the dashed line CC', constructed according to some other embodiments.

FIGS. 6A, 6B and 6C are sectional views of a gate in an IC structure in accordance with some embodiments.

DETAILED DESCRIPTION

Figure 1:
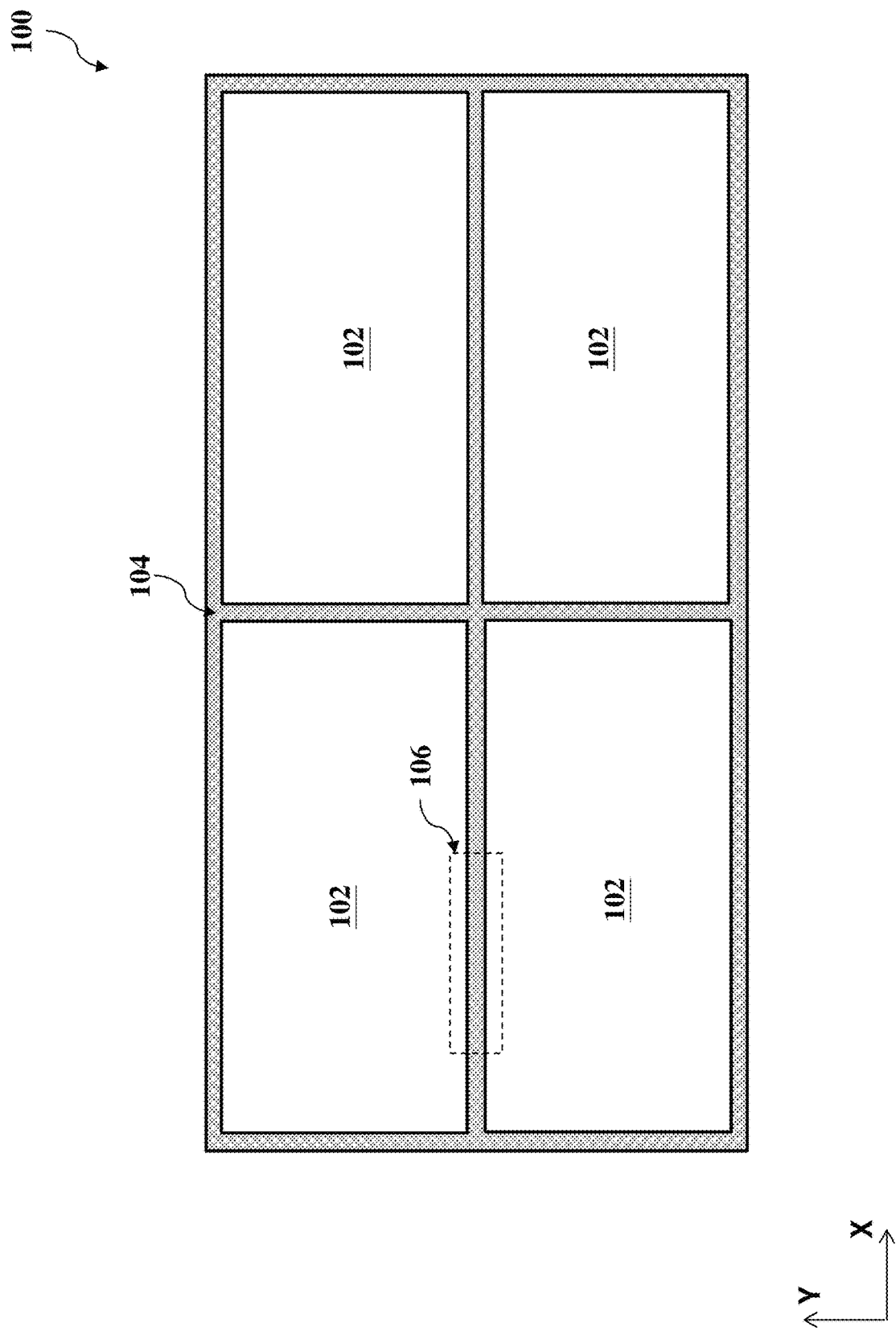
FIG. 1 is a top view of an integrated circuit (IC) structure constructed according to some embodiments.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The present disclosure provides various embodiments of integrated circuit (IC) structure having a plurality IC cells surrounded by a well tap cell. For example, an IC cell is surrounded by a well tap cell and is separated from other IC cells by the well tap cell. The IC cell and the well tap cell share a continuous doped well. The well tap cell includes fin active regions, source/drain (S/D) features and contacts landing on the S/D features. The contacts serve as pick-up and are connected to a power line (such as a ground line) to bias the doped well to provide reliable, accurate and consistent device performance, especially to the analog devices in the IC cells. Particularly, the well tap cell is free of any gate structure and its S/D features are formed using a hard mask with openings to define S/D regions. The S/D features are formed in the well tap cell by etching and epitaxial growth, which are constrained by a hard mask formed in the well tap cell. The hard mask remains in the final IC structure according to some embodiments. In various embodiments, the IC cells include analog field-effect transistors (FETs), digital FETs, static random-access memory (SRAM) devices or other suitable devices.

Figure 2A:
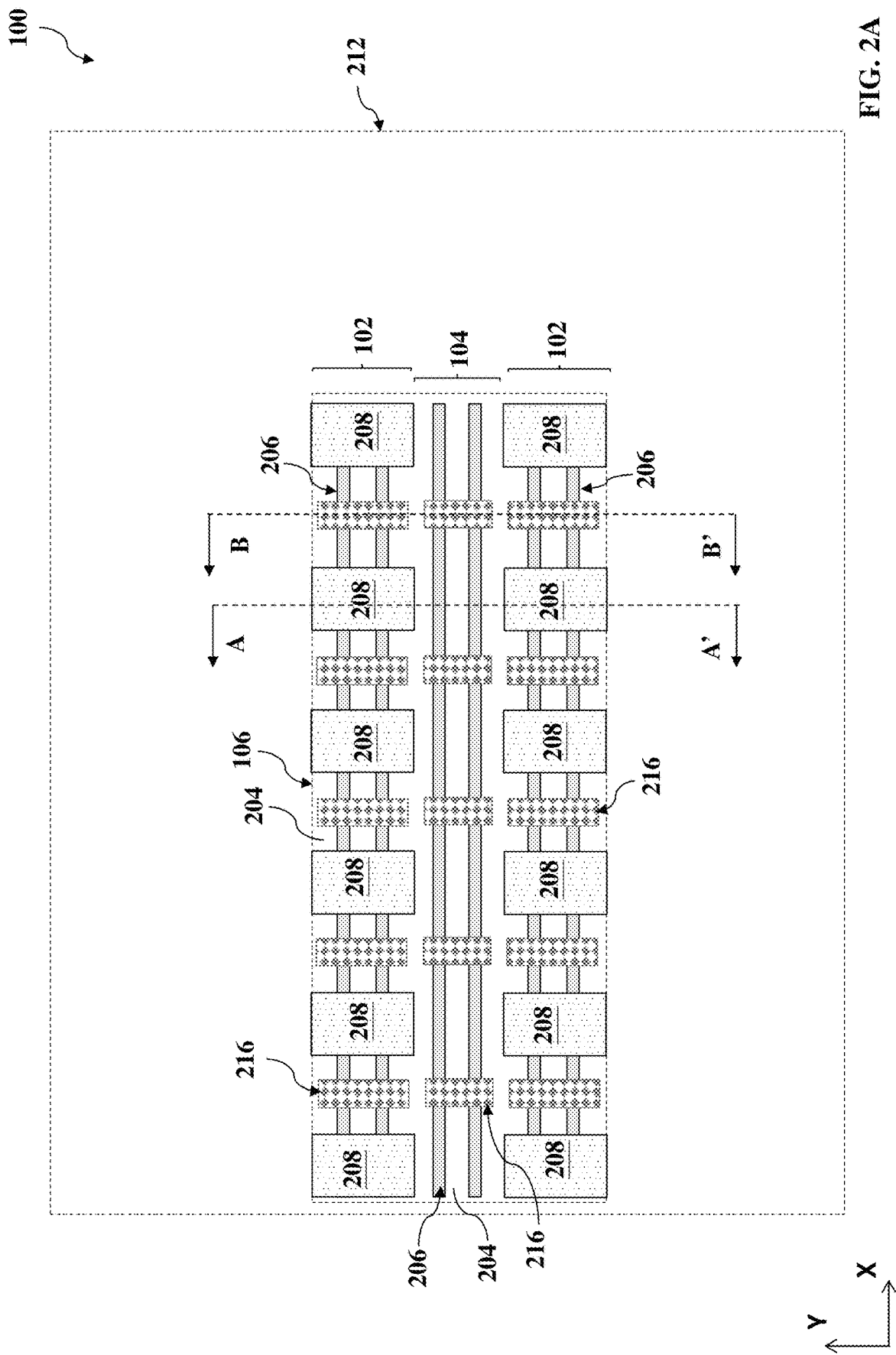
FIG. 2A is a top view of the integrated circuit (IC) structure of FIG. 1, in portion, constructed according to some embodiments.
Figure 2B:
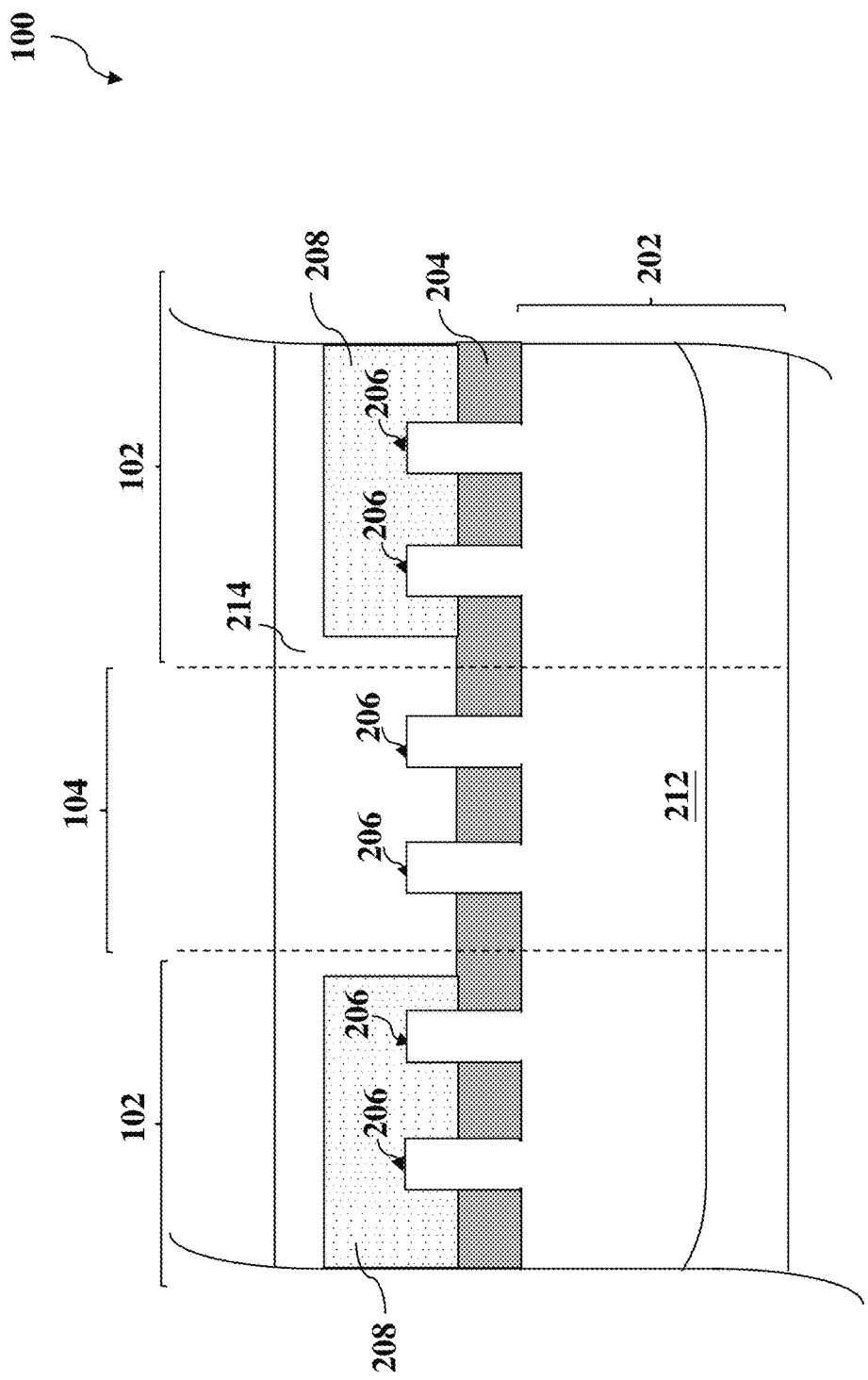
FIG. 2B is a sectional view of the IC structure of FIG. 2A along the dashed line AA', constructed according to some embodiments.
Figure 2C:
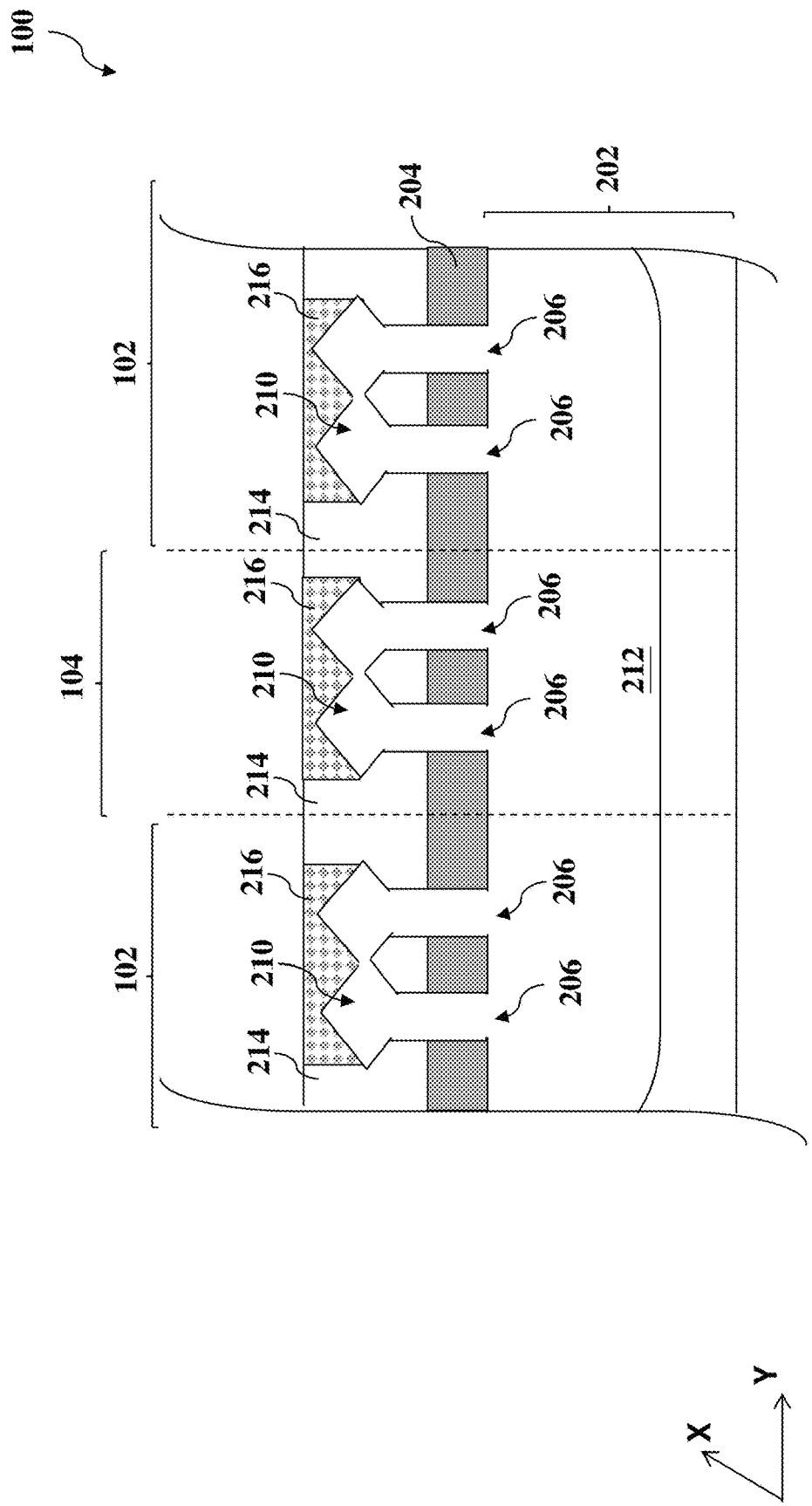
FIG. 2C is a sectional view of the IC structure of FIG. 2A along the dashed line BB', constructed according to some embodiments.

FIG. 1 is a top view of an integrated circuit (IC) structure 100 constructed according to various aspects of the present disclosure. FIG. 2A is a top view of the IC structure 100, in portion. FIGS. 2B and 2C are sectional views of the IC structure 100 of FIG. 2A along the dashed lines AA' and BB', respectively. In the present embodiments, the IC structure 100 is formed on fin active regions and includes fin field-effect transistors (FinFETs). With reference to FIGS. 1, 2A~2C and other figures, the IC structure 100 and a method making the same are collectively described.

In various embodiments, the IC structure 100 includes a plurality of IC cells 102 separated from each other by a well tap cell 104. Particularly, each IC cell 102 is surrounded by the well tap cell 104 and is isolated by the well tap cell 104 from other IC cells. The IC cells 102 include various devices, such as analog FinFETs, digital FinFETs, SRAM devices, other suitable devices, or a combination thereof. The well tap cell 104 is designed to provide bias to a doped well of the IC cells 102 with enhanced circuit performance, such accuracy. A portion 106 of the IC structure 100 is zoomed in and is further illustrated in FIGS. 2A~2C with detailed description.

Referring to FIGS. 2A~2C, the IC structure 100 is formed on a semiconductor substrate 202. The semiconductor substrate 202 includes silicon. Alternatively, the semiconductor substrate 202 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible semiconductor substrates 202 also include a silicon-on-insulator (SOI) substrate. SOI substrates are fabricated using separation by implantation of oxygen (SIMOX), wafer bonding, and/or other suitable methods.

The IC structure 100 includes include shallow trench isolation (STI) features 204 formed on the semiconductor substrate 202 and defining various active regions, such as fin active regions 206 on the semiconductor substrate 202. The fin active regions 206 are extruded above the STI features 204 to provide multiple-surface coupling between the channel and the gate electrode with enhanced device performance. The STI features 204 may be formed by a procedure that includes patterning to form trenches on the semiconductor substrate 202; filling one or more dielectric material in the trenches; and performing a chemical mechanical polishing (CMP) process. The fin active regions 206 may be formed by epitaxial growth, recessing the STI features 204, or a combination thereof.

The fin active regions 206 includes elongated fin active regions oriented along the first direction (X direction), configured in parallel, and disposed in the IC cells 102 and the well tap cell 104. The portion 106 of the IC structure 100 includes two IC cells interposed by a segment of the well tap cell 104 oriented along the first direction. The segment of the well tap cell 104 contacts edges of the two IC cells 102. In the present embodiment, the segment of the well tap cell 104 includes two fin active regions 206 or may alternatively include three fin active regions 206 or a single fin active region 206.

The IC cells 102 includes a plurality of gate stacks 208 formed on the fin active regions 206. The gate stacks 208 have elongated shape and are oriented along the second direction (Y direction). The gate stacks 208 are extended over multiple fin active regions 206 and may extended over from one edge to the opposite edge of an IC cell 102. Each of the gate stacks 208 includes a gate dielectric layer and a gate electrode on the gate dielectric layer. In the present embodiment, the gate dielectric layer includes a high-k dielectric material and the gate electrode includes metal or metal alloy.

The IC cells 102 also include S/D features 210 formed on the fin active regions 206. The S/D features 210 are formed by epitaxial growth with a semiconductor material same to or different from that of the semiconductor substrate 202, such as silicon, germanium, silicon germanium, silicon carbide, or a combination thereof. The formation of the S/D features 210 may include a procedure, such as etching to recess the S/D regions and epitaxially growth. In the IC cells 102, the gate stacks 208 additionally serve as blocker to constrain the etching and the epitaxial growth during the formation of the S/D features 210. The gate stacks 208 and the S/D features are configured into a plurality of field-effect transistors (FETs).

The S/D features 210 are also formed in the well tap cell 104. On contrary to the IC cells 102, the well tap cell 104 is free of any gate stack. Without gate stacks in the well tap cell 104, the gate density is reduced and the size of the well tap cell 104 is also reduced, both being advantages for reduced CMP erosion or dishing effect and increased circuit area. Instead, a hard mask is formed on the well tap cell 104 with openings that define the corresponding S/D regions. The hard mask serves as a blocker to constrain the etching and epitaxial growth during the formation of the S/D features 210 in the well tap cell 104. The hard mask is formed by a procedure that includes deposition, lithography process and etching. The hard mask may be removed after the formation of the S/D features 210 or remain in the final structure of the well tap cell 104, which will be further described later in other embodiments. In some embodiments, adjacent S/D features 210 are epitaxially grown to merge together for increased contact area and reduced contact resistance, as illustrated in FIG. 2C.

The IC structure 100 also includes a doped well 212 extended from an IC cell 102 to the well tap cell 104. The doped well 212 is continuously extended from one IC cell 102 to the well tap cell 104 and further extended to an adjacent IC cell 102. Particularly, the doped well 212 is continuously extended through multiple fin active regions 206 with transition portions underlying the intervening STI features 204, as illustrated in FIG. 2C. In the present embodiment, the doped well 212 is configured such that the IC cells 102 and the well tap cell 104 in FIG. 2A are formed within the continuous doped well 212. In some embodiment, the doped well 212 is a p-typed well and the FETs in the IC cells 102 are n-type FETs.

The IC structure 100 further includes an interlevel dielectric (ILD) layer 214 formed on the fin active regions 206 and the gate stacks 208. The ILD layer 214 is not shown in FIG. 2A for better view of other features underlying the ILD layer 214, such as fin active regions 206 and the gate stacks 208. The ILD layer 214 includes one or more dielectric material, such as silicon oxide, low-k dielectric material, other suitable dielectric material or a combination thereof. The ILD layer 214 is formed by deposition and CMP process according to some embodiments.

Figure 2D:
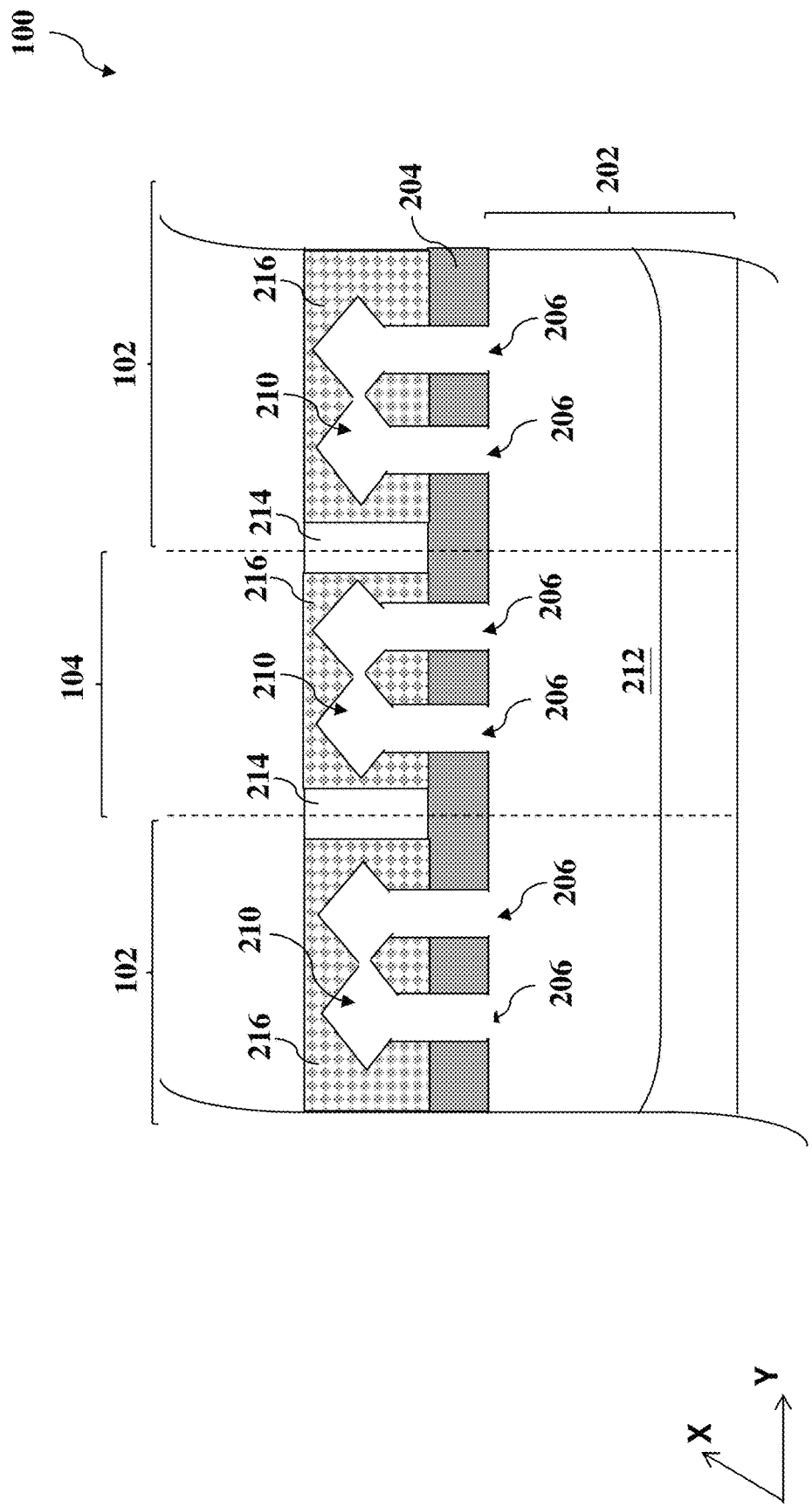
FIG. 2D is a sectional view of the IC structure of FIG. 2A along the dashed line BB', constructed according to some other embodiments.

The IC structure 100 also includes various contacts 216 formed on the S/D features 210. The contacts 216 are conductive and landing on the S/D features 210. In some embodiments, the contacts 216 include tungsten, nickel, cobalt, ruthenium, copper, other metal or metal alloy, or a combination thereof. The contacts 216 may be formed by a procedure that includes patterning, deposition and CMP. In some embodiments, the contacts 216 are formed to be around the S/D features 210, as illustrated in FIG. 2D, for enhanced contact effect and reduced contact resistance. The IC structure 100 further includes an interconnection structure coupled the gate stacks 208 in the IC cells 102 and the contacts 216.

The IC cells 102 and the well tap cell 104 share the doped well 212. The contacts 216 in the well tap cell 104 are connected to a power line to bias the doped well 212 to provide reliable and consistent device performance to the devices in the IC cells 102. For examples, the contacts 216 in the wall tap cell 104 are coupled to a ground line to bias the doped well 212. By using the hard mask, instead of the dummy gate stacks, to constrain the formation (etching and epitaxial growth) of the S/D features 210 in the well tap cell 104, the well tap cell 104 can be placed closer to the IC cells 102 to increase the circuit area and reduce the gate density (therefore reducing the manufacturing risk). This is because that the hard mask is dielectric and can be placed close to the dummy gate stacks without limitation from the design rule.

In some embodiment, the FETs in the IC cells 102 are n-type FETs (NFETs) and the doped well 212 is a p-type doped well (P-well). In some embodiment, the FETs in the IC cells 102 are p-type FETs (PFETs) and the doped well 212 is an n-type doped well (N-well). In some embodiments, the IC structure 100 includes both NFETs and PFETs. The NFETs are grouped into a first set of IC cells and the PFETs are grouped into a second set of IC cells. The first group of IC cells share a P-well with a first well tap cell and the second group of IC cells share an N-well with a second well tap cell. The first well tap cell is connected to a first power line (such as a ground line) to bias the P-well and the second well tap cell is connected to a second power line (such as a high voltage power line) to bias the N-well.

Figure 3:
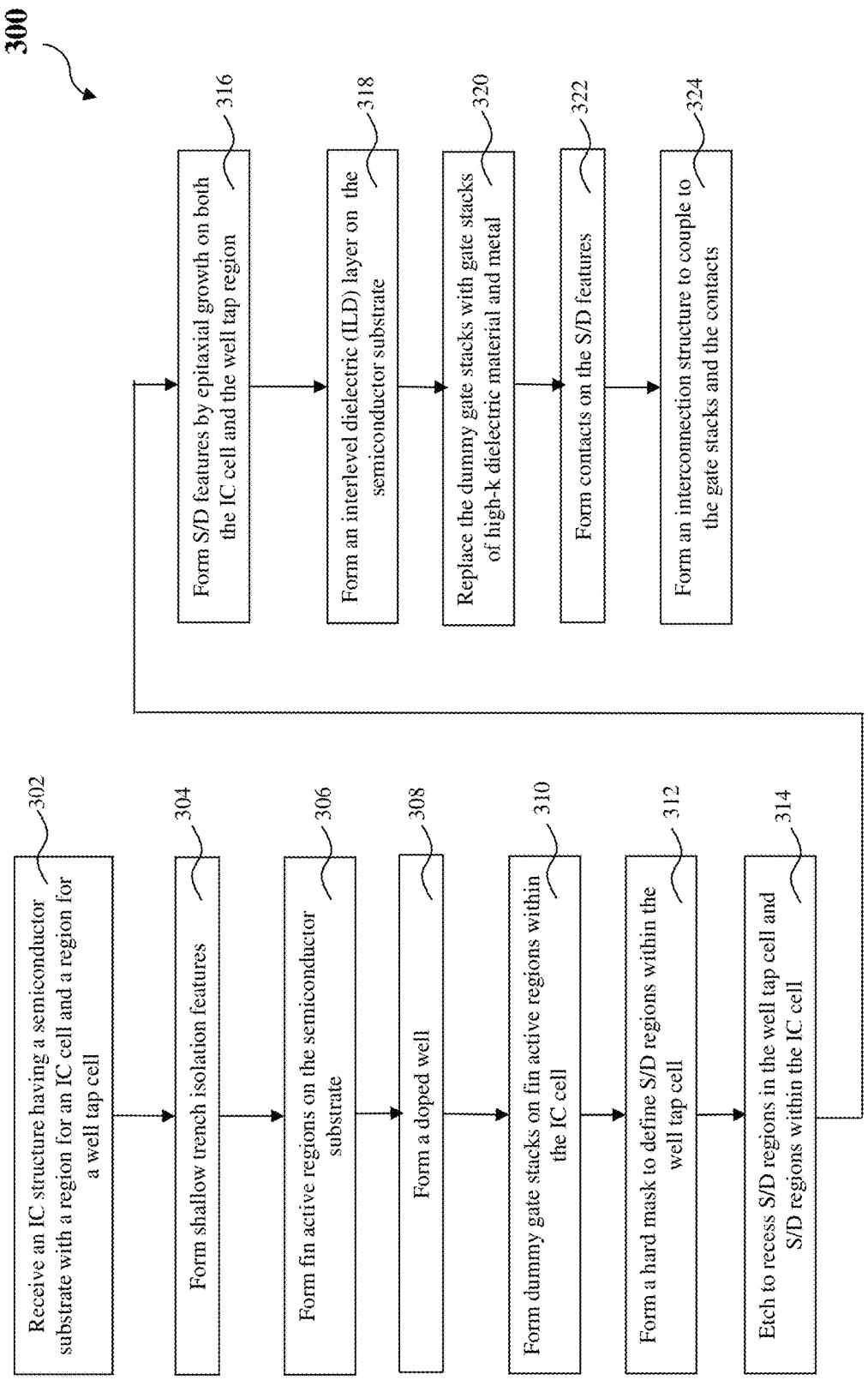
FIG. 3 is a flowchart of a method making an IC structure constructed according to some embodiments.
Figure 5A:
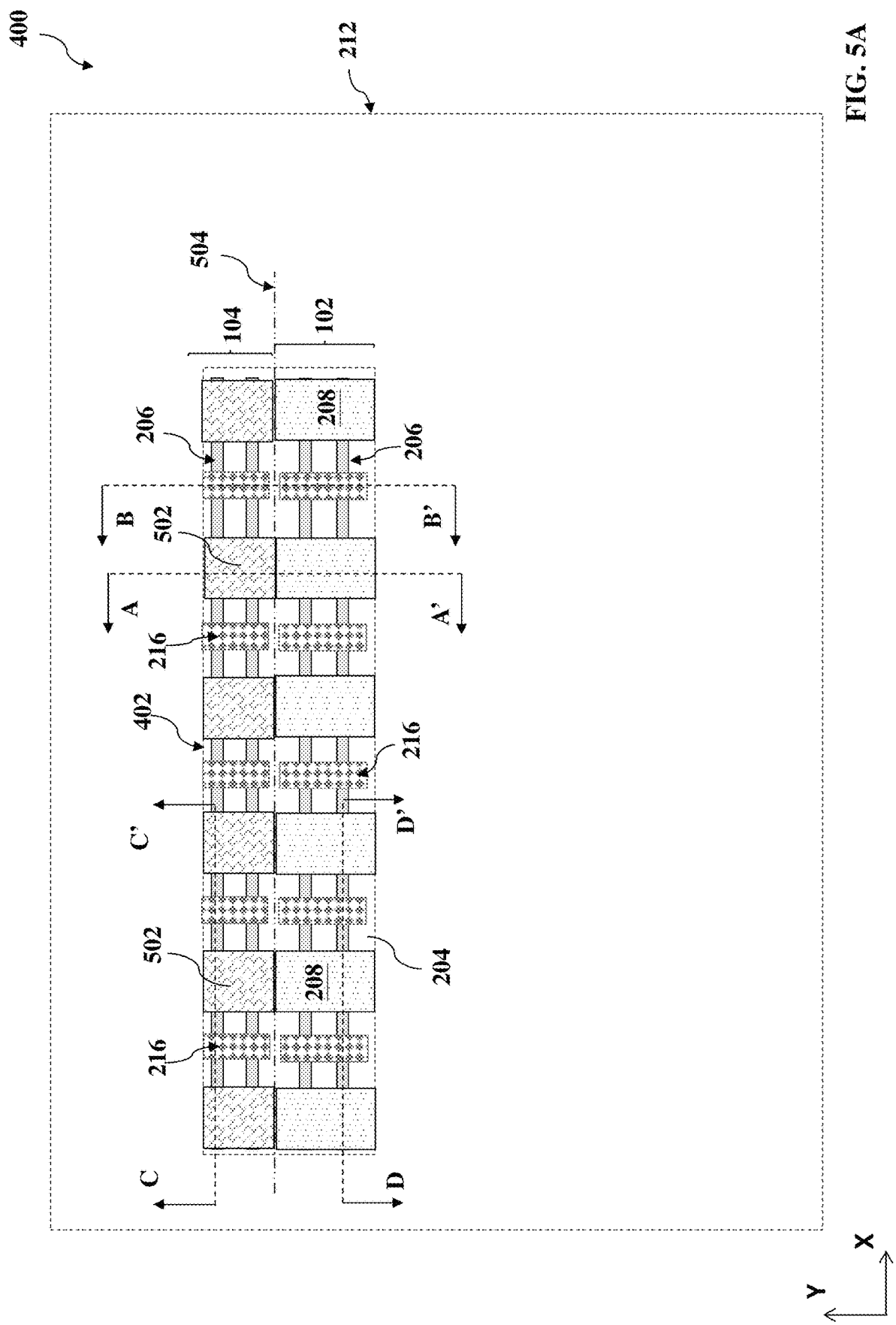
FIG. 5A is a top view of the integrated circuit (IC) structure of FIG. 4, in portion, constructed according to some embodiments.

FIG. 3 is a flowchart of a method 300 making an IC structure (such as the IC structure 100 described above or an IC structure 400 to be described below) in accordance with some embodiments. FIG. 4 is a top view of an IC structure 400. FIG. 5A is a top view of the IC structure 400 in portion. FIGS. 5B, 5C, 5D and 5E are sectional views of the IC structure 400 of FIG. 5A along the dashed lines AA', BB', CC' and DD', respectively. In the present embodiments, the IC structure 400 is formed on fin active regions and includes various FinFETs. Similar to the IC structure 100, the IC structure 400 also includes a plurality IC cells 102 isolated by well tap cell 104. The descriptions of the similar features are not repeated. FIGS. 5A-5E only show a portion 402 of the IC structure 400 constructed in accordance with some embodiments. With reference to FIGS. 3, 4, 5A-5E and other figures, the IC structure 400 and the method 300 are collectively described.

The method 300 begins at a block 302 by receiving an IC structure 400 having a semiconductor substrate 202 with regions for IC cells 102 and a region for a well tap cell 104. Particularly, each IC cell 102 is surrounded by the well tap cell 104. For example, an IC cell 102 may be configured in a rectangle while the well tap cell 104 includes four segments surrounded that IC cell 102.

The method 300 includes an operation 304 to form STI features 204. The STI features 204 include one or more dielectric materials, such as silicon oxide, silicon nitride, fluorinated silica glass (FSG), low-k dielectric material, other suitable dielectric material or a combination thereof. In some embodiments, the STI features 204 are formed by a procedure that includes etching to form trenches, filling the trenches with dielectric material and polishing (such as CMP) to remove the excessive dielectric material and planarize the top surface. One or more etching processes are performed on the semiconductor substrate 202 through openings of soft mask or hard mask. A soft mask may include photoresist and is formed by a lithography process. A hard mask may be formed by a deposition, a lithography process and etching. In various embodiments, the dielectric material is deposited using a chemical vapor deposition (CVD), high density plasma CVD (HDP-CVD), sub-atmospheric CVD (SACVD), high-aspect ratio process (HARP), flowable CVD (FCVD), a spin-on process, or a combination thereof.

The method 300 also includes an operation 306 to form fin active regions 206. The operation 306 includes recessing the STI features 204 such that the fin active regions 206 are extruded above from the STI features 204. The recessing process employs one or more etching steps (such as dry etch, wet etch or a combination thereof) to selectively etch back the STI features 204. For example, a wet etching process using hydrofluoric acid may be used to etch when the STI features 204 are silicon oxide. The fin active regions 206 have elongated shape and are oriented along X direction and are spaced from each other in Y direction. Alternatively, the fin active regions 206 are formed by epitaxial growth or a combination of recessing and epitaxial growth.

The method 300 also includes an operation 308 to form a doped well 212. The doped well 212 is a continuously extended from an IC cell 102 to the well tap cell 104. Furthermore, the doped well 212 is configured and sized to include the IC cell 102 and the well tap cell 104 surrounding the IC cell 102. Particularly, the doped well 212 is continuously extended through multiple fin active regions 206 with transition portions underlying the intervening STI features 204, as illustrated in FIG. 5B. The doped well 212 may be formed by an ion implantation process to introduce suitable dopant into the semiconductor substrate 202. In the present embodiment, the doped well 212 is a P-well with dopant such as boron, while the FinFETs of the IC cell 102 in the doped well 212 are n-typed FinFETs.

The method 300 includes operations to form gate stacks 208 in the IC cells 102. The gate stacks 208 are formed on the fin active regions 206 within the IC cells 102 but are free from the well tap cell 104. In the present embodiment, the gate stacks 208 include high-k dielectric material and metal and are formed by a gate-last process, such as through the operations 310~316, as described below.

The method 300 includes an operation 310 to form dummy gate stacks (to be replaced at later fabrication stage by the gate stacks 208. The dummy gate stacks are at the locations of the gate stacks 208 at this fabrication stage and are not shown in FIGS. 5A~5E). The dummy gate stacks have elongated shapes and are oriented in the Y direction. Each of the dummy gate stacks may be disposed over multiple fin active regions 206. The dummy gate stacks may include polysilicon and may further includes a dielectric material layer (such as silicon oxide) interposed between the polysilicon and the fin active regions 206. The formation of the dummy gate stacks includes depositing the dummy gate materials (such as silicon oxide by thermal oxidation and polysilicon by CVD); and patterning the dummy gate materials. A gate hard mask may be formed on the dummy gate materials and is used as an etch mask during the formation of the dummy gate stacks. In some embodiments, the patterning process includes depositing a hard mask, forming a patterned resist layer on the hard mask by lithography process; etching the hard mask using the patterned resist layer as an etch mask; and etching the gate materials to form the dummy gate stacks using the patterned hard mask as an etch mask. After the formation of the dummy gate stacks, the gate hard mask on the dummy gate stacks may be removed by etching or by the gate-replacement process at operation 316. The dummy gate stacks also serve to define S/D regions in the IC cells 102 and constrain the formation of the S/D features 210 in the IC cells 102, such as functioning to block the etching and epitaxial growth during the formation of the S/D features 210.

In the operation 310, the formation of the dummy gate stacks also includes forming one or more gate spacer on the sidewalls of the gate electrodes. The gate spacers may be used to offset the subsequently formed source/drain features and may be used for designing or modifying the source/drain structure profile. The gate spacers may include any suitable dielectric material, such as a silicon oxide, silicon nitride, silicon oxynitride, other suitable dielectric materials, or combinations thereof. The gate spacers may have multiple films, such as two films (a silicon oxide film and a silicon nitride film) or three films ((a silicon oxide film; a silicon nitride film; and a silicon oxide film). The formation of the gate spacers includes deposition and anisotropic etching, such as dry etching.

The method 300 also includes an operation 312 to form a hard mask 502 within the well tap cell 104 to define the S/D regions function and constrain the formation of the S/D features 210 within the well tap cell 104. As noted above, the well tap cell 104 is free of any gate stack. Instead, the hard mask 502 is formed to serve that function. Particularly, the hard mask 502 is formed on the fin active regions 206 of the well tap cell 104 to constrain the etching and epitaxial growth during the formation of the S/D features 210.

Figure 7:
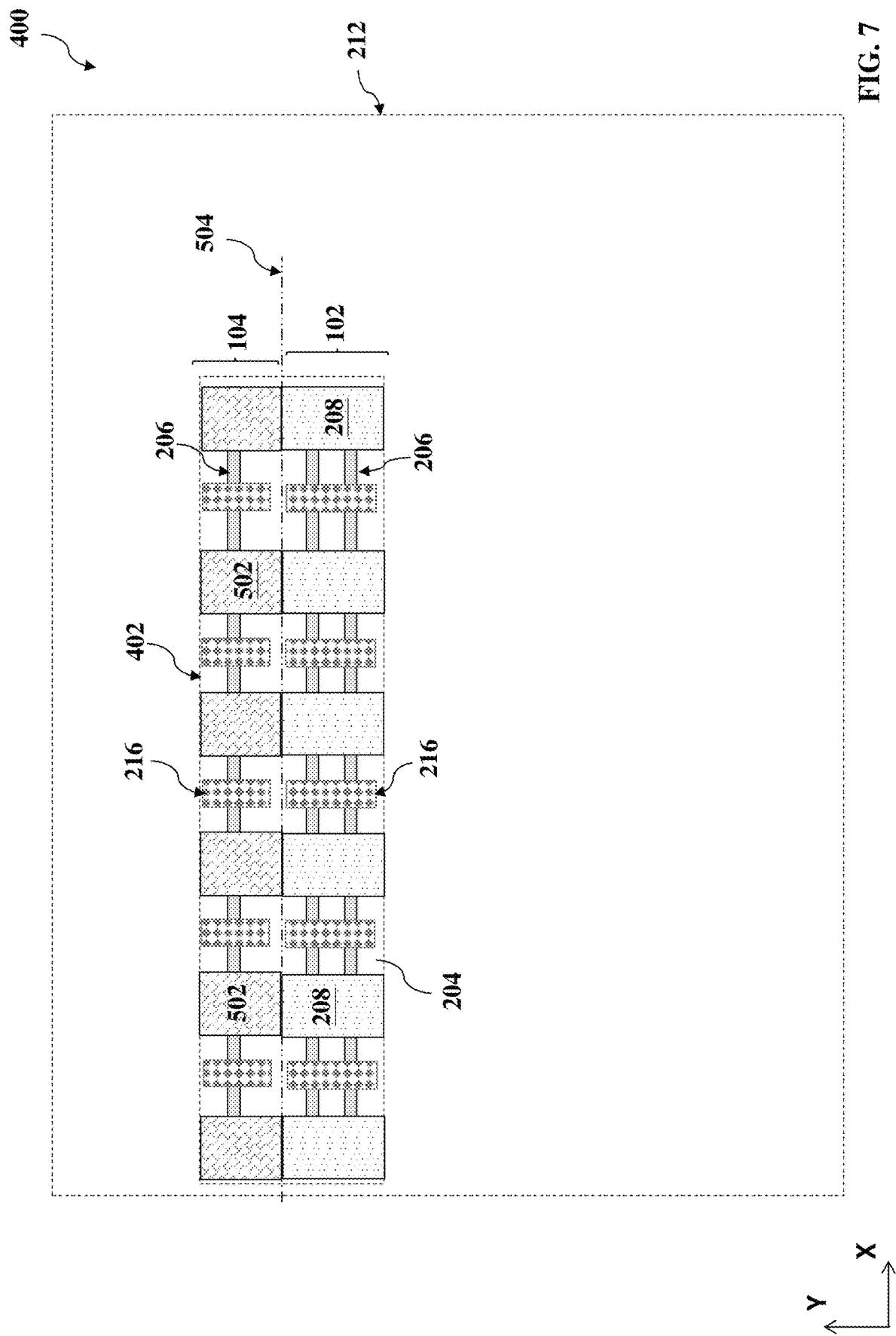
FIGS. 7 and 8 are top views of an IC structure constructed according to various embodiments.
Figure 8:
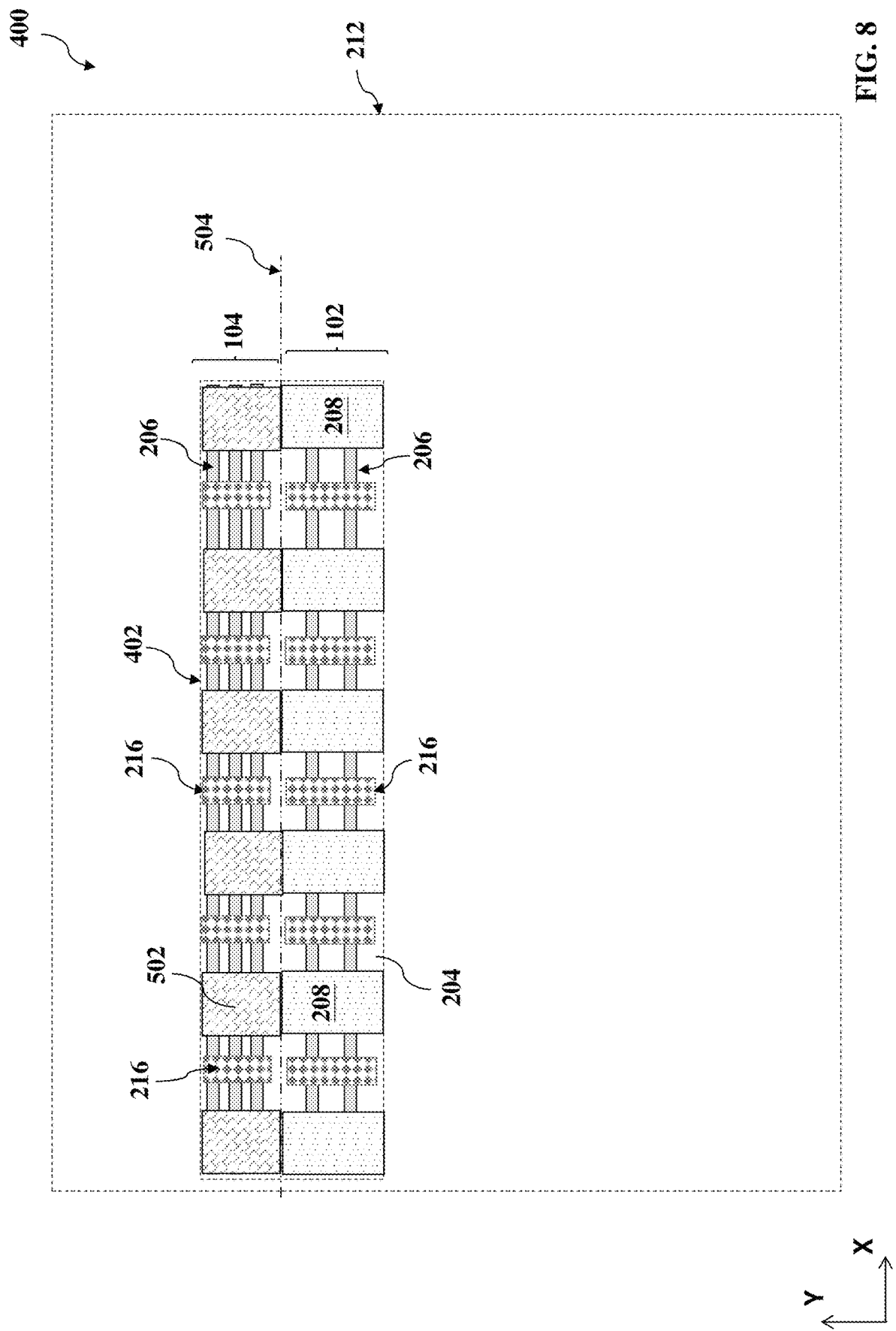

Especially, in FIG. 5A, the IC cell 102 includes an edge 504 contacting a segment of the well tap cell 104. The segment of the well tap cell 104 includes two fin active regions 206 in parallel and oriented along the edge 504. In some embodiments, the segment of the well tap cell 104 includes a single fin active region 206 oriented along the edge 504, as illustrated in FIG. 7 in a top view; or three fin active regions 206 206 in parallel and oriented along the edge 504, as illustrated in FIG. 8 in a top view.

The hard mask 502 includes portions with elongated shape oriented along Y direction and aligned with the dummy gate stacks in the adjacent IC cell 102. Each portion of the hard mask 502 extends over two fin active regions 206 as in FIG. 5A, or three or more fin active region 206 as in other embodiments. The gaps among portions of the hard mask 502 define the S/D regions in the S/D regions within the well tap cell 104. Since the hard mask 502 is dielectric and the portions of the hard mask 502 are not gate stacks, there is no design rule that limits the spacing between the ends of the dummy gate stacks and the portions of the hard mask 502. Therefore, the size of the well tap cell 104 can be minimized and the gate density of the IC structure 400 can be reduced.

The hard mask 502 includes a dielectric material, such as semiconductor oxide, semiconductor nitride, semiconductor oxynitride, and/or semiconductor carbide, and in an embodiment, the hard mask 502 includes a silicon oxide film and a silicon nitride film. The hard mask is formed by deposition, and a patterning process. In the present embodiment, the hard mask 502 is deposited on the semiconductor substrate 202 and is patterned by lithography process and etching.

The hard mask 502 may be deposited by atomic layer deposition (ALD), CVD, HDP-CVD, other suitable deposition processes, or a combination thereof. A patterned photoresist layer is formed on the hard mask by a lithography process.

Then a lithography process is applied to form a patterned photoresist layer on the hard mask 502. A photoresist layer includes a photosensitive material that causes the photoresist layer to undergo a property change when exposed to light, such as ultraviolet (UV) light, deep UV (DUV) light or extreme UV (EUV) light. This property change can be used to selectively remove exposed or unexposed portions of the photoresist layer by a developing process. A lithography process includes spin-on coating a resist layer, soft baking of the resist layer, mask aligning, exposing, post-exposure baking, developing the resist layer, rinsing, and drying (e.g., hard baking). Alternatively, a lithographic process may be implemented, supplemented, or replaced by other methods such as mask-less lithography, electron-beam writing, and ion-beam writing.

Thereafter, an etching process is performed on the hard mask 502 through the openings of the patterned photoresist layer, thereby transferring the pattern from the patterned photoresist layer to the hard mask 502. The etching process may include wet etching, dry etching or a combination thereof. The etching process may include multiple etching steps. For example, the hard mask 502 includes a silicon oxide film and a silicon nitride film. The silicon oxide film may be etched by a diluted hydro-fluorine solution and the silicon nitride film may be etched by a phosphoric acid solution. The patterned photoresist layer may be removed after the patterning the hard mask 502 or at other proper fabrication stage by wet stripping to plasma ashing.

The method 300 then proceeds to formation of the S/D features 210 using the dummy gate stacks within the IC cells 102 and the hard mask 502 within the well tap cell 104 to constrain the formation of the S/D features 210 within the IC cells 102 and the S/D features 210 within the well tap cell 104, respectively. In the present embodiment, the formation of the S/D features includes etching to recess the S/D regions and epitaxial growth.

The method 300 includes an operation 314 to perform an etching process to recess the S/D regions. The etching process is applied to selectively etch the fin active regions 206. Furthermore, the dummy gate stacks and the hard mask 502 function as etch mask to constrain the etching process to the S/D regions. More specifically, in the IC cells 102, the etching process is constrained to the S/D regions by the dummy gate stacks; and in the well tap cell 104, the etching process is constrained to the S/D regions by the hard mask 502. The etching process may include any suitable etching technique such as dry etching, wet etching, and/or other etching methods (e.g., reactive ion etching (RIE)). In some embodiments, the etching process includes multiple etching steps with different etching chemistries, designed to etching the substrate to form the trenches with a desired recess profile for improved device performance. In some examples, the semiconductor material of the fin active regions 206 may be etched by a dry etching process using a fluorine-based etchant.

Figure 5C:
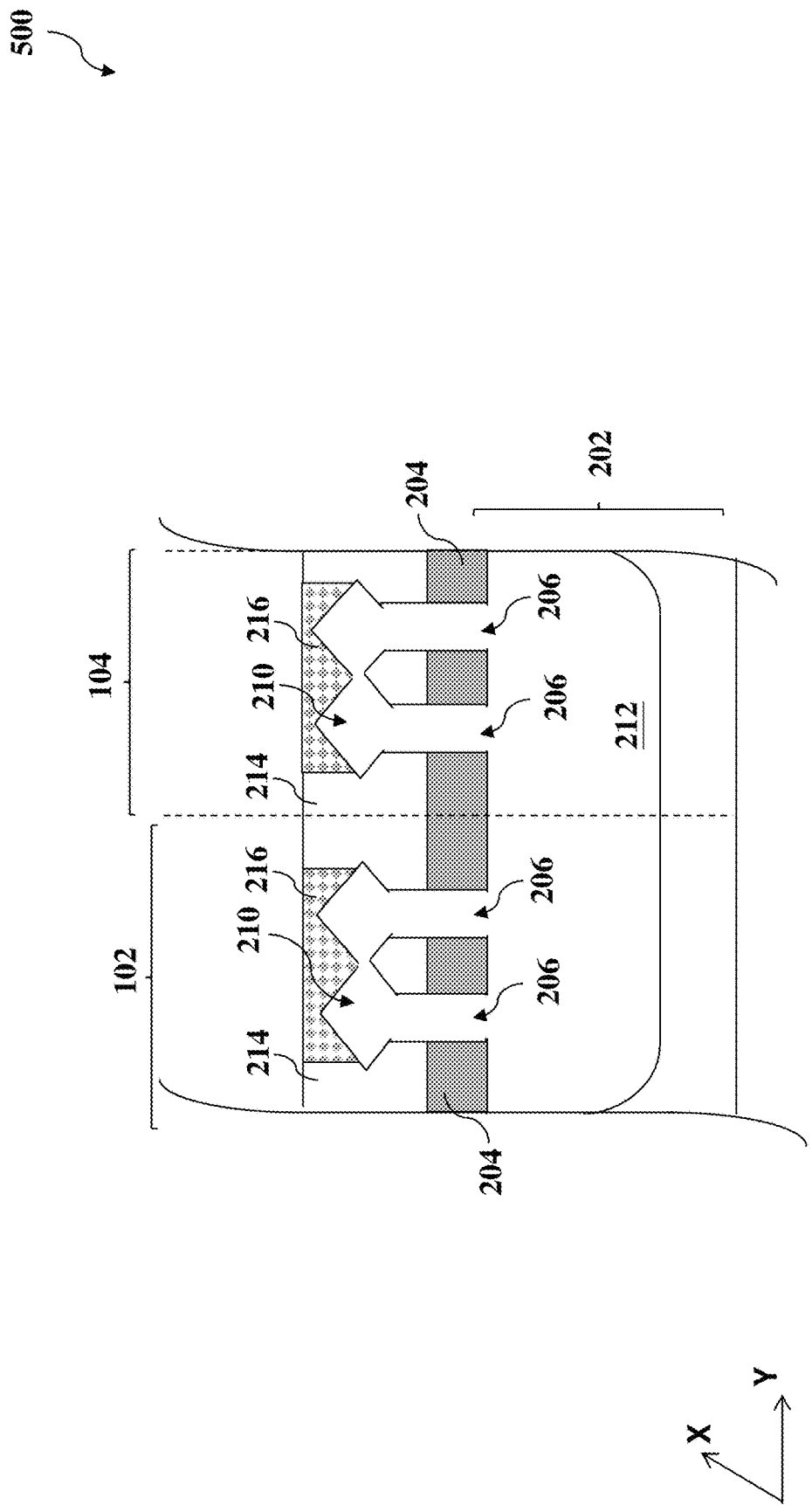
FIG. 5C is a sectional view of the IC structure of FIG. 5A along the dashed line BB', constructed according to some embodiments.
Figure 5E:
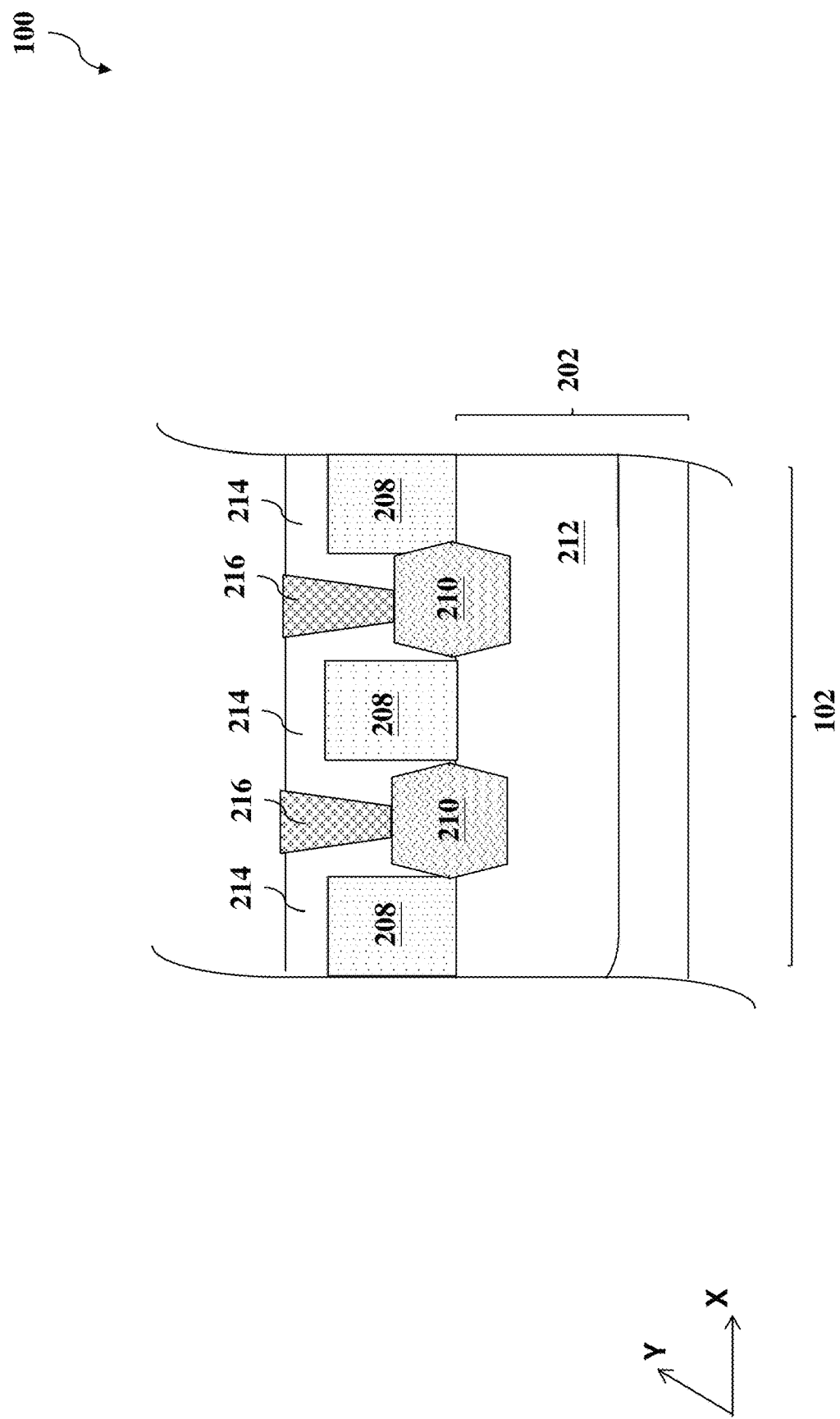
FIG. 5E is a sectional view of the IC structure of FIG. 5A along the dashed line DD', constructed according to some other embodiments.

The method 300 proceeds to an operation 316 to perform an epitaxial growth to selectively grow a semiconductor material (such as silicon or other suitable semiconductor material for strain effect) in the recessed S/D regions, thereby forming the S/D features 210. Similarly, the epitaxial growth is also constrained by the dummy gate stacks and the hard mask 502. The S/D features 210 may be in-situ doped during the epitaxial growth by introducing doping species including: p-type dopants (such as boron or $BF_2$) or n-type dopants (such as phosphorus or arsenic). If the S/D features 210 are not in-situ doped, an implantation process may be performed to introduce the corresponding dopant into the S/D features 210. In some embodiments, the S/D features 210 for an n-type FET include epitaxial grown SiC or Si doped with phosphorous, while the S/D features 210 for a p-type FET include epitaxial grown Ge or SiGe doped with boron. In some other embodiments, the S/D features 210 include more than one semiconductor material layers. For example, a silicon germanium layer is epitaxially grown on the recessed S/D regions within the source/drain regions and a silicon layer is epitaxially grown on the silicon germanium layer. One or more annealing processes may be performed thereafter to activate the S/D features 210. Suitable annealing processes include rapid thermal annealing (RTA), laser annealing processes, other suitable annealing technique or a combination thereof. In the present embodiment, the S/D features 210 formed on the two fin active regions 206 in the well tap cell 104 are merged, as illustrated in FIG. 5C, to increase the contact area and reduce the contact resistance.

The method 300 proceeds to an operation 318 to form an ILD layer 214 on the semiconductor substrate 202, covering the fin active regions 206 and the S/D features 210. The ILD layer 214 surrounds the dummy gate stacks allowing the dummy gate stacks to be removed and replaced by the gate stacks 208. The ILD layer 214 acts as an insulator that supports and isolates the conductive traces, such as contacts to be formed. The ILD layer 214 may include any suitable dielectric material, such as a semiconductor oxide, a semiconductor nitride, a semiconductor oxynitride, low-k dielectric material, other suitable dielectric materials, or a combination thereof. In some embodiments, the formation of the ILD layer 214 includes deposition and CMP to provide a planarized top surface. In some embodiments, the operation 318 additionally includes forming an etch stop layer underlying the ILD layer 214. The etch stop layer has a composition different from that of the ILD layer 214 to provide etch selectivity and stop the etching process to form contacts.

The method 300 proceeds to an operation 320 for gate replacement, in which the dummy gate stacks are replaced by the gate stacks 208 with high-k dielectric material and metal. The gate replacement includes an etching process to remove the dummy gate stacks; depositions to deposit gate materials (such as high-k dielectric material and metal); and CMP to remove the excessive gate materials and planarize the top surface. The gate stacks 208 are further described below with reference to FIGS. 6A~6C as sectional views of the gate stack 208 in accordance with various embodiments.

A gate stack 208 includes a gate dielectric layer 602, a gate electrode 604 disposed on the gate dielectric layer 602, and a gate spacer 606 formed on the sidewalls of the gate electrode 604. In various embodiments, the gate dielectric layer 602 may include metal oxide, metal nitride, such as LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfSiO, $(Ba,Sr)TiO_3$ (BST), $Al_2O_3$, $Si_3N_4$, oxynitrides (SiON), or other suitable dielectric materials. The gate electrode 604 may include Ti, Ag, Al, TiAlN, TaC, TaCN, TaSiN, Mn, Zr, TiN, TaN, Ru, Mo, Al, WN, Cu, W, or any suitable materials. The gate spacer 606 may include silicon oxide, silicon nitride, other suitable dielectric material or a combination thereof.

The gate spacer 606 is formed during the operation 310 to form the dummy gate stacks. The gate dielectric layer 602 may be formed at the operation 310 and remain as a component of the gate stack 208, such as illustrated in FIG. 6A. The gate dielectric layer 602 may include two films, such as an interfacial layer 602A and a high-k dielectric material layer 602B, such as illustrated in FIG. 6B. In alternative embodiments, both the gate dielectric layer 602 and the gate electrode 604 are formed by the gate replacement at the operation 320, such as illustrated in FIG. 6C. In this case, the high-k dielectric material layer 602B is deposited, such as by ALD, therefore is U-shaped. In furtherance of the embodiments, the gate electrode 604 may include multiple layers, such as a work function metal layer 604A and a filling metal 604B, may additionally include other films, such as a capping layer.

In various embodiments, the interfacial layer 602A may include silicon oxide, silicon nitride, silicon oxynitride, and/or other suitable material. The interfacial layer 602A is deposited by a suitable method, such as ALD, CVD, ozone oxidation, etc. The high-k dielectric material layer 602B is deposited on the interfacial layer 602A by a suitable technique, such as ALD, CVD, metal-organic CVD (MOCVD), PVD, thermal oxidation, combinations thereof, and/or other suitable techniques.

The work functional metal layer 604A includes a conductive layer of metal or metal alloy with proper work function such that the corresponding FET is enhanced for its device performance. The work function metal layer 604A is different for a pFET and a nFET, respectively referred to as an n-type WF metal and a p-type WF metal. In some embodiments, the n-type WF metal includes tantalum (Ta). In other embodiments, the n-type WF metal includes titanium aluminum (TiAl), titanium aluminum nitride (TiAlN), tungsten nitride (WN), or combinations thereof. In some embodiments, the p-type WF metal includes titanium nitride (TiN), tantalum nitride (TaN), tungsten nitride (WN), titanium aluminum (TiAl), or combinations thereof. In various embodiments, the filling metal 604B includes aluminum, tungsten, copper, other suitable metal, or a combination thereof. The work function metal layer 604A and the filling metal 604B are deposited by suitable deposition technique, such as PVD.

The method 300 proceeds to an operation 322 to form contacts 216. The contacts 216 are landing on respective S/D features 210. Especially, within the well tap cell 104, the contacts 216 landing on the S/D features 210 are further connected to a power line for biasing the doped well 212 to provide reliable and consistent device performance to devices in the IC cells 102. The contacts 216 include a conductive plug of a conductive material (including metal and metal alloy), such as tungsten (W), aluminum (Al), aluminum alloy, copper (Cu), cobalt (Co), other suitable metal/metal alloy, or a combination thereof. In some embodiments, the contacts 216 further includes a barrier layer lining the contact holes to enhance the material integration, such as increasing adhesion and reducing interdiffusion. The barrier layer may include more than one film. The barrier layer is formed on the sidewalls and the bottom surface of the conductive plugs. In some embodiments, the barrier layer includes titanium and titanium nitride (Ti/TiN), tantalum and tantalum nitride (Ta/TaN), copper silicide, or other suitable material. Alternatively, the contacts 216 are barrier-free. In some embodiments, the contacts 216 are landing on the top surfaces of the S/D features 210, as illustrated in FIG. 5C. Alternatively, contacts 216 are formed surrounding the S/D features 210, such as illustrated FIG. 2D, with further increased contact area and reduced contact resistance.

The operation 322 includes a patterning process applied to the ILD layer 214 to form contact hole; and filling the contact holes with one or more conductive material by deposition; and CMP. The patterning process to form the contact holes further includes a lithography process and etching. The patterning process may further use a hard mask for patterning. The deposition may include PVD, plating, CVD, ALD or other suitable deposition method.

Other fabrication operations may be implemented before, during and after the operations of the method. Some operations may be implemented by an alternative operation. For example, the method 300 includes an operation 324 by forming a multiple layer interconnection (MLI) on the IC structure 400. The MLI includes various conductive features to couple the various device features (such as the gate stacks 208 and the S/D features 210) to form a functional circuit. Particularly, the MLI includes multiple metal layers to provide horizontal electrical routing and vias to provide vertical electrical routing. The MLI also includes multiple ILD layers to isolate various conductive features from each other.

In various embodiments, the conductive features (such as metal lines and vias) of the MLI includes aluminum, copper, aluminum/silicon/copper alloy, titanium, titanium nitride, tungsten, polysilicon, metal silicide, or combinations. The MLI may use aluminum interconnection formed by deposition and etching, or copper interconnection formed by damascene process.

Some operations may be implemented by an alternative operation. For example, a patterning process may be implemented through double patterning or multiple patterning. In some embodiments, prior to the filling in the conductive material in the contact holes, silicide may be formed on the S/D features 210 to further reduce the contact resistance. The silicide includes silicon and metal, such as titanium silicide, tantalum silicide, nickel silicide or cobalt silicide. The silicide may be formed by a process referred to as self-aligned silicide, which further includes metal deposition, annealing to react the metal with silicon, and etching to remove the unreacted metal.

The present disclosure provides various embodiments of integrated circuit (IC) structure having a plurality of IC cells surrounded by a well tap cell. For example, an IC cell is surrounded by a well tap cell and is separated from other IC cells by the well tap cell. The IC cell and the well tap cell share a continuous doped well. The well tap cell includes fin active regions, source/drain (S/D) features and contacts landing on the S/D features. The contacts serve as pick-up and are connected to a power line (such as a ground line) to bias the doped well to provide reliable, accurate and consistent device performance, especially to the analog devices in the IC cells. Particularly, the well tap cell is free of any gate structure and its S/D features are formed using a hard mask with openings to define S/D regions. The S/D features are formed in the well tap cell by etching and epitaxial growth, which are constrained by a hard mask formed in the well tap cell. The hard mask remains in the final IC structure according to some embodiments. In various embodiments, the IC cells include analog FETs, digital FETs, SRAM devices or other suitable devices. By utilizing the disclosed IC structure and the method making the same, the gate density is reduced and the size of the well tap cell is also reduced, both being advantages for reduced CMP erosion or dishing effect and increased circuit area.

Thus, the present disclosure provides a method making an IC structure in accordance with some embodiments. The method includes receiving a semiconductor substrate that includes an integrated circuit (IC) cell and a well tap cell surrounding the IC cell; forming first fin active regions in the well tap cell and second fin active regions in the IC cell; forming a hard mask within the well tap cell, wherein the hard mask includes openings that define first source/drain (S/D) regions on the first fin active region of the well tap cell; forming gate stacks on the second fin active regions within the IC cell and absent from the well tap cell, wherein the gate stacks define second S/D regions on the second fin active regions; epitaxially growing first S/D features in the first S/D regions using the hard mask to constrain the epitaxially growing; and forming contacts landing on the first S/D features within the well tap cell.

The present disclosure provides a method making an IC structure in accordance with some other embodiments. The method includes receiving a semiconductor substrate that includes an integrated circuit (IC) cell and a well tap cell surrounding the IC cell; forming first fin active regions in the well tap cell and second fin active regions in the IC cell; forming a hard mask within the well tap cell, wherein the hard mask includes openings that define first source/drain (S/D) regions on the first fin active region of the well tap cell; forming gate stacks on the second fin active regions in the IC cell, the gate stacks defining second S/D regions on the second fin active regions; performing an etching process to recess the first S/D regions and the second S/D regions using the hard mask and gate stacks as a collective etch mask; epitaxially growing first S/D features in the first S/D regions and second S/D features in the second S/D regions using the hard mask and the gate stacks to constrain the epitaxially growing; and forming contacts landing on the first S/D features in the well tap cell.

The present disclosure provides an integrated circuit (IC) structure in accordance with some other embodiments. The IC structure includes a semiconductor substrate having an IC cell and a well tap cell surrounding the IC cell; first fin active regions formed within the well tap cell and second fin active regions formed on the IC cell; source/drain (S/D) features formed on the first fin active regions; a plurality of gate stacks formed on the second fin active regions; and contacts formed on the S/D features. The well tap cell is free of any gate electrode.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit (IC) structure, comprising:
   a semiconductor substrate having an IC cell with field-effect transistors (FETs) and a well tap cell surrounding the IC cell;
   a doped well continuously extended from the well tap cell to the IC cell such that the IC cell and the well tap cell are within the doped well;
   first active regions formed within the well tap cell and second active regions formed on the IC cell;
   first source/drain (S/D) features formed on the first active regions and second S/D features formed on the second active regions;
   gate stacks formed on the second active regions, wherein the well tap cell is free of any gate electrode; and
   first contacts formed on the first S/D features and second contacts formed the second S/D features.

2. The IC structure of claim 1, wherein the first contacts are connected to a power line to bias the doped well to provide reliable and consistent device performance of the IC cell.

3. The IC structure of claim 2, wherein
   the IC cell includes an edge oriented in a first direction;
   the well tap cell includes a segment oriented in the first direction and adjacent the edge of the IC cell; and
   the first active regions in the segment of the well tap cell include two active regions in parallel and oriented in the first direction.

4. The IC structure of claim 3, wherein one of the first S/D features continuously extends from one of the two active regions to another one of the two active regions.

5. The IC structure of claim 4, wherein
   each of the first and second active regions is surrounded by a shallow trench isolation (STI) feature; and
   a corresponding one of the first contacts continuously extends from a top surface of the one of the first S/D features and a top surface of the STI feature.

6. The IC structure of claim 5, further comprising a hard mask disposed on the first active regions and being adjacent the first S/D features.

7. The IC structure of claim 6, wherein
the gate stacks are adjacent the edge the IC cell; and
the hard mask includes portions in the segment of the well tap cell, the portions of the hard mask being extended over the two active regions and aligned with the gate stacks, respectively.

8. The IC structure of claim 7, wherein
the FETs are analog n-type FETs;
the doped well is a p-type doped well; and
the hard mask is free from the IC cell.

9. An integrated circuit (IC) structure, comprising:
a semiconductor substrate having an IC cell with field-effect transistors (FETs) and a well tap cell surrounding the IC cell;
a doped well continuously extended from the well tap cell to the IC cell such that the IC cell and the well tap cell are within the doped well;
first active regions formed within the well tap cell and second active regions formed on the IC cell;
first source/drain (S/D) features formed on the first active regions and second S/D features formed on the second active regions;
gate stacks formed on the second active regions, wherein the well tap cell is free of any gate electrode;
first contacts formed on the first S/D features and second contacts formed the second S/D features; and
a hard mask disposed on the first active regions and being adjacent the first S/D features.

10. The IC structure of claim 9, wherein
the IC cell includes an edge oriented in a first direction;
the well tap cell includes a segment oriented in the first direction and adjacent the edge of the IC cell; and
the first active regions in the segment of the well tap cell include two active regions in parallel and oriented in the first direction.

11. The IC structure of claim 10, wherein
one of the first S/D features continuously extends from one of the two active regions to another one of the two active regions;
each of the first and second active regions is surrounded by a shallow trench isolation (STI) feature; and
a corresponding one of the first contacts continuously extends from a top surface of the one of the first S/D features and a top surface of the STI feature.

12. The IC structure of claim 11, wherein
the gate stacks are adjacent the edge the IC cell; and
the hard mask includes portions in the segment of the well tap cell, the portions of the hard mask being extended over the two active regions and aligned with the gate stacks, respectively.

13. The IC structure of claim 12, wherein
the FETs are analog n-type FETs;
the doped well is a p-type doped well; and
the hard mask is free from the IC cell.

14. The IC structure of claim 13, wherein the first contacts are connected to a power line to bias the doped well to provide reliable and consistent device performance of the IC cell.

15. A method, comprising:
receiving a semiconductor substrate that includes an integrated circuit (IC) cell and a well tap cell surrounding the IC cell;
forming first active regions in the well tap cell and second active regions in the IC cell, wherein each of the first and second active regions is surrounded by an isolation feature;
forming a hard mask within the well tap cell, wherein the hard mask includes openings that define first source/drain (S/D) regions on the first active regions of the well tap cell;
forming gate stacks on the second active regions within the IC cell and absent from the well tap cell, wherein the gate stacks define second S/D regions on the second active regions;
epitaxially growing first S/D features in the first S/D regions using the hard mask to constrain the epitaxially growing; and
forming contacts landing on the first S/D features within the well tap cell and extending to a top surface of the isolation feature.

16. The method of claim 15, wherein the epitaxially growing further includes epitaxially growing second S/D features on the second S/D regions of the second active regions within the IC cell using the gate stacks to constrain the epitaxially growing.

17. The method of claim 15, further comprising performing an etching process to recess the first S/D regions and the second S/D regions using the hard mask and gate stacks collectively as an etch mask.

18. The method of claim 15, wherein the hard mask includes portions longitudinally aligned with the gate stacks, respectively.

19. The method of claim 15, wherein
the forming of the first active regions in the well tap cell includes forming two active regions in parallel;
the well tap cell includes a segment along an edge of the IC cell; and
the two active regions are oriented and extended along the edge.

20. The method of claim 15, wherein the forming a hard mask within the well tap cell includes
forming a dielectric material layer on the first and second active regions;
forming a patterned photoresist layer on the dielectric material layer by a lithography process; and
etching the dielectric material layer using the patterned photoresist layer as an etch mask, resulting in the hard mask being free from the IC cell.

* * * * *